United States Patent
Lee et al.

(10) Patent No.: US 11,631,663 B2
(45) Date of Patent: Apr. 18, 2023

(54) CONTROL CIRCUIT AND HIGH ELECTRON MOBILITY ELEMENT

(71) Applicant: Vanguard International Semiconductor Corporation, Hsinchu (TW)

(72) Inventors: Jian-Hsing Lee, Puzih (TW); Yeh-Jen Huang, Hsinchu (TW); Wen-Hsin Lin, Jhubei (TW); Chun-Jung Chiu, Tainan (TW); Hwa-Chyi Chiou, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 505 days.

(21) Appl. No.: 16/856,757

(22) Filed: Apr. 23, 2020

(65) Prior Publication Data

US 2021/0335771 A1    Oct. 28, 2021

(51) Int. Cl.
*H01L 27/02* (2006.01)
*H01L 29/20* (2006.01)
*H01L 29/778* (2006.01)

(52) U.S. Cl.
CPC ........ *H01L 27/027* (2013.01); *H01L 27/0255* (2013.01); *H01L 29/20* (2013.01); *H01L 29/7787* (2013.01)

(58) Field of Classification Search
CPC . H01L 28/20; H01L 27/0248; H01L 27/0605; H01L 27/027; H01L 27/0255; H01L 29/20; H01L 29/7787; H01L 27/0285; H01L 27/0262; H01L 27/0251; H01L 27/0266; H01L 23/60
See application file for complete search history.

(56) References Cited

U.S. PATENT DOCUMENTS

| | | | |
|---|---|---|---|
| 2014/0346570 A1* | 11/2014 | Ueno | H01L 27/0605 257/195 |
| 2018/0026029 A1* | 1/2018 | Lin | H01L 28/20 361/56 |

FOREIGN PATENT DOCUMENTS

| | | |
|---|---|---|
| TW | 520563 B | 2/2003 |
| TW | 200830533 A | 7/2008 |

OTHER PUBLICATIONS

Taiwanese Office Action and Search Report for Taiwanese Application No. 109103792, dated Jun. 23, 2020.

* cited by examiner

*Primary Examiner* — Selim U Ahmed
(74) *Attorney, Agent, or Firm* — Birch, Stewart, Kolasch & Birch, LLP

(57) ABSTRACT

A control circuit applied in a specific element and including a first transistor and an electrostatic discharge (ESD) protection circuit is provided. The specific element has a III-V semiconductor material and includes a control electrode, a first electrode and a second electrode. The first transistor is coupled between the first electrode and the second electrode and has the III-V semiconductor material. The ESD protection circuit is coupled to the control electrode, the first transistor and the second electrode. In response to an ESD event, the ESD protection circuit provides a discharge path to release the ESD current from the control electrode to the second electrode.

19 Claims, 3 Drawing Sheets

CONTROL CIRCUIT AND HIGH ELECTRON MOBILITY ELEMENT

BACKGROUND OF THE DISCLOSURE

Field of the Disclosure

The disclosure relates to a high electron mobility element, and more particularly to a high electron mobility element that comprises an electrostatic discharge (ESD) protection circuit.

Description of the Related Art

High electron mobility transistors (HEMT) are widely used in high-power semiconductor devices to meet the requirements on consumer electronic products, communication hardware components, electric vehicles, and in such industries as home appliances, because they possess the favorable advantage of having high output current. However, when an electrostatic discharge (ESD) event occurs, the HEMT may be damaged by the ESD current.

BRIEF SUMMARY OF THE DISCLOSURE

In accordance with an embodiment of the disclosure, a control circuit, which is applied in a specific element, comprises a first transistor and an electrostatic discharge (ESD) protection circuit. The specific element has a III-V semiconductor material and comprises a control electrode, a first electrode and a second electrode. The first transistor is coupled between the first electrode and the second electrode and has the III-V semiconductor material. The ESD protection circuit is coupled to the control electrode, the first transistor and the second electrode. In response to an ESD event, the ESD protection circuit provides a discharge path to release the ESD current from the control electrode to the second electrode.

In accordance with another embodiment of the disclosure, a high electron mobility element comprises a substrate, a control electrode, a first electrode, a second electrode, and a control circuit. The substrate has a III-V semiconductor material. The control electrode is formed on the substrate. The first electrode is formed on the substrate. The second electrode is formed on the substrate. The control circuit comprises a first transistor and an ESD protection circuit. The first transistor is coupled between the first electrode and the second electrode and has the III-V semiconductor material. The ESD protection circuit is coupled to the control electrode, the first transistor and the second electrode. In response to an ESD event, the ESD protection circuit provides a discharge path to release the ESD current from the control electrode to the second electrode.

BRIEF DESCRIPTION OF THE DRAWINGS

The disclosure can be more fully understood by referring to the following detailed description and examples with references made to the accompanying drawings, wherein.

DETAILED DESCRIPTION OF THE DISCLOSURE

Figure 1:
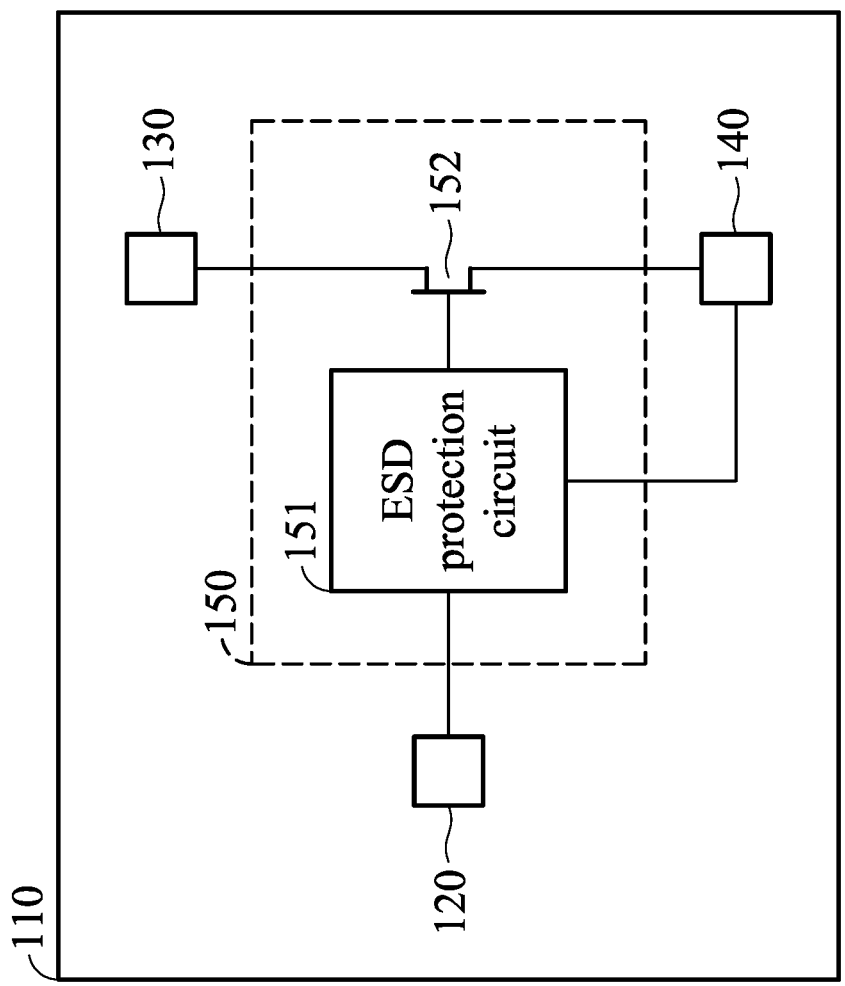
FIG. 1 is a schematic diagram of an exemplary embodiment of a high electron mobility element according to various aspects of the present disclosure.

The present disclosure will be described with respect to particular embodiments and with reference to certain drawings, but the disclosure is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the disclosure.

FIG. 1 is a schematic diagram of an exemplary embodiment of a high electron mobility element according to various aspects of the present disclosure. As shown in FIG. 1, the high electron mobility element 100 comprises a substrate 110, a control electrode 120, electrodes 130, 140, and a control circuit 150. In one embodiment, the high electron mobility element 100 is a high electron mobility transistor (HEMT). In this embodiment, the substrate 110 has a III-V semiconductor material, such as gallium arsenide (GaAs), indium phosphide (InP), gallium nitride (GaN), or SiGe.

The control electrode 120 and the electrodes 130 and 140 are formed on the substrate 110. In one embodiment, when the high electron mobility element 100 is a HEMT, the control electrode 120 serves as a gate of the HEMT. In this case, the electrode 130 serves as the drain of the HEMT, and the electrode 140 serves as the source of the HEMT.

The control circuit 150 is formed on the substrate 110. In this embodiment, the control circuit 150 is integrated into the high electron mobility element 100 to prevent an electrostatic discharge (ESD) current from influencing the high electron mobility element 100. As shown in FIG. 1, the control circuit 150 comprises an ESD protection circuit 151 and a transistor 152.

The transistor 152 is coupled between the electrodes 130 and 140. In one embodiment, the transistor 152 has the III-V semiconductor material. The structure of the transistor 152 is not limited in the present disclosure. In this embodiment, the transistor 152 is also a HEMT. As shown in FIG. 1, the drain of the transistor 152 is coupled to the electrode 130, the source of the transistor 152 is coupled to the electrode 140, and the gate of the transistor 152 is coupled to the ESD protection circuit 151.

When an ESD event occurs in one of the electrodes 130 or 140 and the other is coupled to ground, the voltage of the gate of the transistor 152 increases gradually due to a parasitic capacitor (not shown) between the gate and the drain of the transistor 152. When the voltage between the gate and the source of the transistor 152 is higher than a threshold voltage of the transistor 152, the transistor 152 is turned on. Therefore, the ESD current is released from the electrode 130 to the electrode 140 or from the electrode 140 to the electrode 130.

In this embodiment, the ESD protection circuit 151 is coupled to the control electrode 120, the transistor 152 and the electrode 140 to prevent ESD current from entering the gate of the transistor 152 from the control electrode 120. For example, when an ESD event occurs in the control electrode 120 and the electrode 140 is coupled to ground, the ESD protection circuit 151 provides a discharge path (not shown) to release the ESD current from the control electrode 120 to the electrode 140. Therefore, the gate of the transistor 152 is not damaged by ESD stress. However, when no ESD event occurs, the ESD protection circuit 151 cuts off the discharge path. At this time, the high electron mobility element 100 operates according to the voltage levels in the control electrode 120 and the electrodes 130 and 140.

Figure 2:
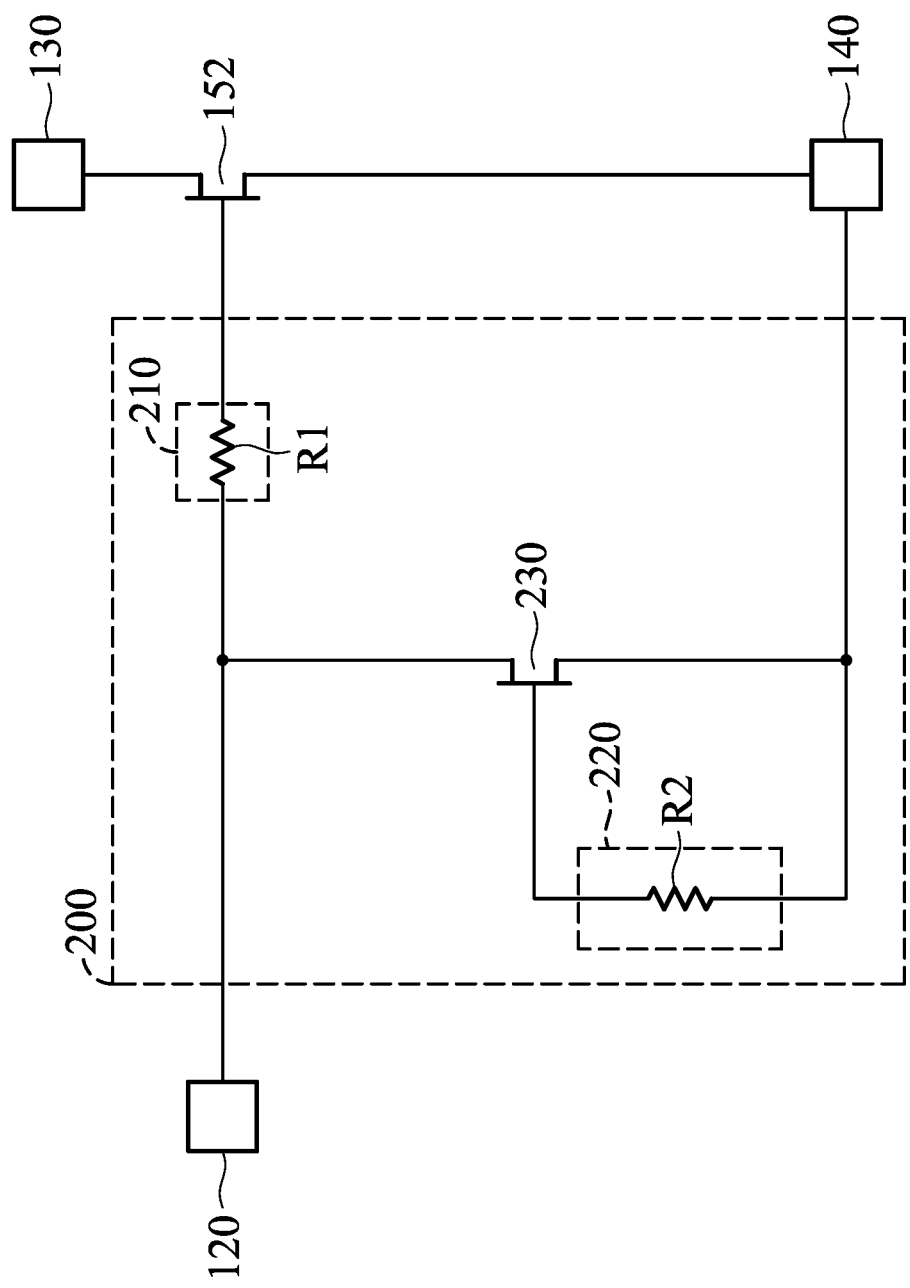
FIG. 2 is a schematic diagram of an exemplary embodiment of an electrostatic discharge (ESD) protection circuit according to various aspects of the present disclosure.

FIG. 2 is a schematic diagram of an exemplary embodiment of an electrostatic discharge (ESD) protection circuit according to various aspects of the present disclosure. In this embodiment, the ESD protection circuit 200 comprises impedance elements 210 and 220, and a transistor 230. The impedance element 210 is coupled between the control electrode 120 and the transistor 152. In one embodiment, the impedance element 210 is a resistor R1. The resistor R1 is coupled between the control electrode 120 and the gate of the transistor 152. The resistance of the resistor R1 may be within 100 Ω~200Ω. The structure of impedance element 210 is not limited in the present disclosure. In other embodiments, the impedance element 210 is a transistor. In this case, the transistor serving as the impedance element 210 is also a HEMT.

The impedance element 220 is coupled between the transistor 230 and the electrode 140. The structure of impedance element 220 is not limited in the present disclosure. In one embodiment, the impedance element 220 is a resistor R2. In this case, the resistor R2 is coupled between the gate of the transistor 230 and the electrode 140. The present disclosure does not limit the structure of impedance element 220. In other embodiments, the impedance element 220 is a transistor. In this case, the transistor serving as the impedance element 220 may be a HEMT.

The transistor 230 is coupled between the control electrode 120 and the electrode 140. In one embodiment, the transistor 230 has the III-V semiconductor material. In this case, the transistor 230 and the high electron mobility element 100 are formed on the same substrate (e.g., 110). The structure of transistor 230 is not limited in the present disclosure. In this embodiment, the transistor 230 is also a HEMT. The drain of the HEMT serving as the transistor 230 is coupled to the control electrode 120. The source of the HEMT serving as the transistor 230 is coupled to the electrode 140. The gate of the HEMT serving as the transistor 230 is coupled to the impedance element 220.

When an ESD event occurs in the control electrode 120 and the electrode 140 is coupled to ground, the voltage of the gate of the transistor 230 is increased gradually due to a parasitic capacitor (not shown) between the gate and the drain of the transistor 230. When the voltage between the gate and the source of the transistor 230 is higher than the threshold voltage of the transistor 230, the transistor 230 is turned on to release the ESD current from the control electrode 120 to the electrode 140. Therefore, the ESD current does not enter the gate of the transistor 152. When no ESD event occurs, the impedance element 220 pulls down the voltage of the gate of the transistor 230 to avoid turning on the transistor 230.

Additionally, when an ESD event occurs in the electrode 130 and the control electrode 120 is coupled to ground, the voltages of the gate of the transistor 152 and the gate of the transistor 230 are increased gradually due to the parasitic capacitor between the gate and the drain of the transistor 152 and the parasitic capacitor between the gate and the drain of the transistor 230. When the voltage between the gate and the source of the transistor 152 is higher than the threshold voltage of the transistor 152, the transistor 152 is turned on. When the voltage between the gate and the source of the transistor 230 is higher than the threshold voltage of the transistor 230, the transistor 230 is turned on. Therefore, the ESD current from the electrode 130 passes through the transistor 152, the electrode 140 and the transistor 230 to the control electrode 120.

Similarly, when an ESD event occurs in the control electrode 120 and the electrode 130 is grounded, the voltage of the gate of the transistor 230 is increased gradually due to parasitic capacitor between the gate and the drain of the transistor 230. When the voltage between the gate and the source of the transistor 230 is higher than the threshold voltage of the transistor 230, the transistor 230 is turned on. At this time, since part of the current passes through the impedance element 210, the voltage at the gate of the transistor 152 is increased gradually. When the voltage between the gate and the source of the transistor 152 is higher than the threshold voltage of the transistor 152, the transistor 152 is turned on. Therefore, the ESD current from the control electrode 120 passes through the transistor 230, the electrode 140 and the transistor 152 to the electrode 130.

In other embodiments, the channel size of the transistor 230 or the resistance of the impedance element 220 is adjusted to turn on the transistor 230 quickly. Therefore, the transistor 230 is immediately turned on to avoid damage to the gate of the transistor 152 by the ESD current when the ESD event occurs. Furthermore, the size of the transistor 230 may be increased or the turning-on resistance (Ron) of the transistor 230 is reduced to adjust the performance of the ESD protection circuit 200.

Figure 3:
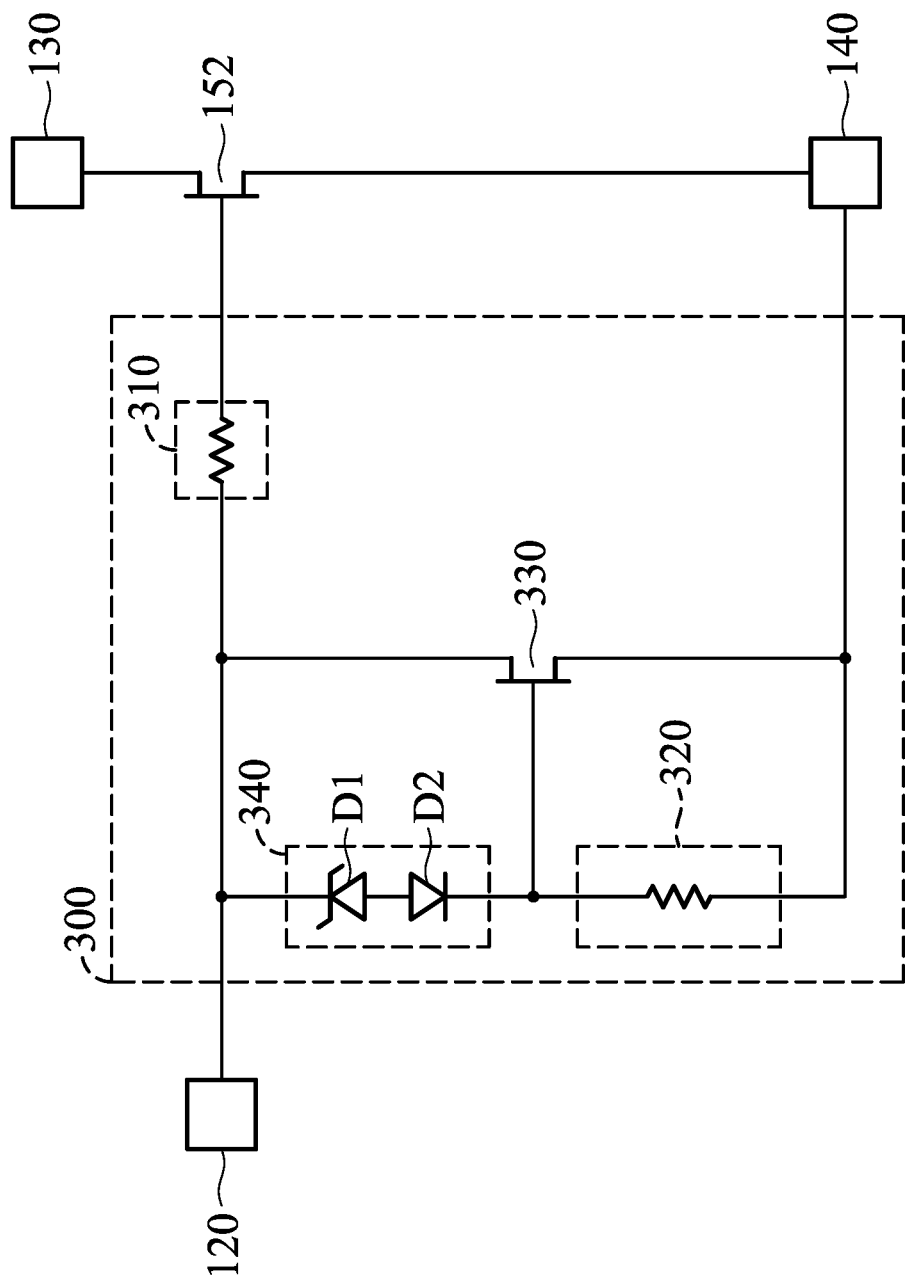
FIG. 3 is a schematic diagram of another exemplary embodiment of the electrostatic discharge (ESD) protection circuit according to various aspects of the present disclosure.

FIG. 3 is a schematic diagram of another exemplary embodiment of the electrostatic discharge (ESD) protection circuit according to various aspects of the present disclosure. In this embodiment, the ESD protection circuit 300 comprises impedance elements 310 and 320, a transistor 330 and a back-to-back diode pair 340. The impedance element 310 is coupled between the control electrode 120 and the transistor 152. The impedance element 320 is coupled to the transistor 330 and the electrode 140. Since the features of the impedance elements 310 and 320 are the same as the features of the impedance elements 210 and 220, the descriptions of the features of the impedance elements 310 and 320 are omitted.

The transistor 330 is coupled to the control electrode 120 and the electrode 140. In one embodiment, the transistor 330 has the III-V semiconductor material. In this embodiment, the transistor 230 is also a HEMT. The gate of the HEMT is coupled to one terminal of the impedance element 320. The drain of the HEMT is coupled to the control electrode 120. The source of the HEMT is coupled to the other terminal of the impedance element 320 and the electrode 140.

The back-to-back diode pair 340 is coupled between the control electrode 120 and the transistor 330. In this embodiment, the back-to-back diode pair 340 comprises diodes D1 and D2. The cathode of the diode D1 is coupled to the control electrode 120. The anode of the diode D1 is coupled to the anode of the diode D2. The cathode of the diode D2 is coupled to the gate of the transistor 330 and the impedance element 320. The kinds of diodes D1 and D2 are not limited in the present disclosure. In one embodiment, the diode D1 is a Schottky diode, and the diode D2 is a PN junction diode.

When an ESD event occurs in the control electrode 120 and the electrode 140 is coupled to ground, the voltage at the gate of the transistor 330 is increased gradually due to the parasitic capacitor between the gate and the drain of the transistor 330. In this embodiment, since part of the current passes through the back-to-back diode pair 340, the voltage at the gate of the transistor 330 rises faster. Since the transistor 330 is turned on quickly, the ESD current is released from the control electrode 120 to the electrode 140. Therefore, the gate of the transistor 152 is not damaged by the ESD current. When no ESD event occurs, the impedance element 320 pulls the voltage at the gate of the transistor 330 down to avoid turning on the transistor 330.

When an ESD event occurs in the electrode 130 and the control electrode 120 is coupled to ground, the voltages of the gate of the transistor 152 and the gate of the transistor 330 are increased gradually due to the parasitic capacitor between the gate and the drain of the transistor 152 and the parasitic capacitor between the gate and the drain of the transistor 330. In this embodiment, since part of the current passes through the back-to-back diode pair 340, the voltage of the gate of the transistor 330 rises faster. When the voltage between the gate and the source of the transistor 152 is higher than the threshold voltage of the transistor 152 and the voltage between the gate and the source of the transistor 330 is higher than the threshold voltage of the transistor 330, the transistors 152 and 330 are turned on. Therefore, the ESD current from the electrode 130 passes through the transistor 152, the electrode 140 and the transistor 330 to the control electrode 120.

When an ESD event occurs in the control electrode 120 and the electrode 130 is coupled to ground, the voltage of the gate of the transistor 330 is increased gradually due to the parasitic capacitor between the gate and the drain of the transistor 330 and the back-to-back diode pair 340. When the voltage between the gate and the source of the transistor 330 is higher than the threshold voltage of the transistor 330, the transistor 330 is turned on. At this time, since part of the current passes through the impedance element 320, the voltage at the gate of the transistor 152 is also increased gradually. When the voltage between the gate and the source of the transistor 152 is higher than the threshold voltage of the transistor 152, the transistor 152 is turned on. Therefore, the ESD current from the control electrode 120 passes through the transistor 330, the electrode 140 and the transistor 152 to the electrode 130.

In other embodiments, the channel size of the transistor 330 or the resistance of the impedance element 320 is adjusted to turn on the transistor 330 quickly. Therefore, the transistor 330 is immediately turned on to prevent the gate of the transistor 152 from becoming damaged by the ESD current when the ESD event occurs. Furthermore, the size of the transistor 330 may be increased or the turning-on resistance of the transistor 330 is reduced to adjust the performance of the ESD protection circuit 300.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A control circuit applied in a specific element, wherein the specific element has a III-V semiconductor material and comprises a control electrode, a first electrode and a second electrode, comprising:
   a first transistor coupled between the first electrode and the second electrode, having the III-V semiconductor material, and comprising a first gate, a first drain, and a first source; and
   an electrostatic discharge (ESD) protection circuit coupled to the control electrode, the first transistor and the second electrode,
   in response to an ESD event, the ESD protection circuit provides a discharge path to release an ESD current from the control electrode to the second electrode,
   wherein the ESD protection circuit comprises:
      a second transistor coupled between the control electrode and the second electrode and comprising a second gate, a second drain and a second source;
      a first impedance element comprising:
         a first terminal directly connected to the second drain and the control electrode; and
         a second terminal directly connected to the first gate; and
      a second impedance element coupled to the second transistor and the second electrode.

2. The control circuit as claimed in claim 1, further comprising:
   a back-to-back diode pair coupled between the control electrode and the second transistor.

3. The control circuit as claimed in claim 2, wherein the back-to-back diode pair comprises:
   a first diode comprising a first cathode and a first anode, wherein the first cathode is coupled to the control electrode; and
   a second diode comprising a second cathode and a second anode, wherein the second cathode is coupled to the second transistor, and the second anode is coupled to the first anode.

4. The control circuit as claimed in claim 3, wherein the first diode is a Schottky diode, and the second diode is a PN junction diode.

5. The control circuit as claimed in claim 1, wherein each of the first transistor and the second transistor has the III-V semiconductor material.

6. The control circuit as claimed in claim 1, wherein each of the first impedance element and the second impedance element is a resistor.

7. The control circuit as claimed in claim 1, wherein the first transistor comprises a first gate coupled to the first impedance element, a first drain coupled to the first electrode and a first source coupled to the second electrode.

8. The control circuit as claimed in claim 7, wherein the second transistor comprises a second gate coupled to the second impedance element, a second drain coupled to the control electrode and a second source coupled to the second electrode.

9. The control circuit as claimed in claim 1, wherein in response to no ESD event occurring, the ESD protection circuit cuts off the discharge path.

10. The control circuit as claimed in claim 1, wherein in response to the ESD event occurring in the first electrode and the control electrode being grounded, the first transistor and the second transistor are turned on.

11. A high electron mobility element comprising:
a substrate having a III-V semiconductor material;
a control electrode formed on the substrate;
a first electrode formed on the substrate;
a second electrode formed on the substrate; and
a control circuit comprising:
a first transistor coupled between the first electrode and the second electrode, having the III-V semiconductor material, and comprising a first gate, a first drain, and a first source; and
an ESD protection circuit coupled to the control electrode, the first transistor and the second electrode,
wherein in response to an ESD event, the ESD protection circuit provides a discharge path to release an ESD current from the control electrode to the second electrode,
wherein the ESD protection circuit comprises:
a second transistor coupled between the control electrode and the second electrode and comprising a second gate, a second drain, and a second source;
a first impedance element comprising:
a first terminal directly connected to the second drain and the control electrode; and
a second terminal directly connected to the first gate; and
a second impedance element coupled to the second transistor and the second electrode.

12. The high electron mobility element as claimed in claim 11, further comprising:
a back-to-back diode pair coupled between the control electrode and the second transistor.

13. The high electron mobility element as claimed in claim 12, wherein the back-to-back diode pair comprises:
a first diode comprising a first cathode and a first anode, wherein the first cathode is coupled to the control electrode; and
a second diode comprising a second cathode and a second anode, wherein the second cathode is coupled to the second transistor, and the second anode is coupled to the first anode.

14. The high electron mobility element as claimed in claim 13, wherein the first diode is a Schottky diode, and the second diode is a PN junction diode.

15. The high electron mobility element as claimed in claim 11, wherein each of the first transistor and the second transistor has the III-V semiconductor material.

16. The high electron mobility element as claimed in claim 11, wherein each of the first impedance element and the second impedance element is a resistor.

17. The high electron mobility element as claimed in claim 11, wherein the first transistor comprises a first gate coupled to the first impedance element, a first drain coupled to the first electrode and a first source coupled to the second electrode.

18. The high electron mobility element as claimed in claim 17, wherein the second transistor comprises a second gate coupled to the second impedance element, a second drain coupled to the control electrode and a second source coupled to the second electrode.

19. The high electron mobility element as claimed in claim 11, wherein in response to no ESD event occurring, the ESD protection circuit cuts off the discharge path.

* * * * *